United States Patent
Lin et al.

(10) Patent No.: US 9,817,048 B2
(45) Date of Patent: Nov. 14, 2017

(54) IMAGE SENSOR POWER SUPPLY NOISE DETECTION

(71) Applicant: OMNIVISION TECHNOLOGIES, INC., Santa Clara, CA (US)

(72) Inventors: Yingkan Lin, San Jose, CA (US); Liang Zuo, San Jose, CA (US); Liping Deng, Cupertino, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 148 days.

(21) Appl. No.: 14/964,159

(22) Filed: Dec. 9, 2015

(65) Prior Publication Data

US 2017/0168104 A1    Jun. 15, 2017

(51) Int. Cl.
*G01R 29/26* (2006.01)

(52) U.S. Cl.
CPC .................... *G01R 29/26* (2013.01)

(58) Field of Classification Search
CPC  G01R 29/08; H03F 3/45475; H03F 2200/261
See application file for complete search history.

(56) References Cited

U.S. PATENT DOCUMENTS

| | | | |
|---|---|---|---|
| 7,355,429 B2 | 4/2008 | Jenkins et al. | |
| 9,644,961 B2 | 5/2017 | Aaltonen | |
| 2002/0070812 A1* | 6/2002 | Sumi | H03L 7/087 331/11 |
| 2008/0180071 A1 | 7/2008 | Moraveji | |
| 2009/0027563 A1* | 1/2009 | Huang | H03F 1/26 348/731 |
| 2009/0153085 A1* | 6/2009 | Gonder | H02P 6/34 318/400.17 |
| 2012/0299647 A1 | 11/2012 | Honjo et al. | |
| 2013/0335867 A1 | 12/2013 | Shinde | |

FOREIGN PATENT DOCUMENTS

JP    2003-324753    11/2003

OTHER PUBLICATIONS

Muhtaroglu, A. et al., "On-Die Droop Detector for Analog Sensing of Power Supply Noise", IEEE Journal of Solid-State Circuits, vol. 39, No. 4, Apr. 2004, pp. 651-660.
Sehgal, A. et al., "On-chip Real-Time Power Supply Noise Detector", Proceedings of the 32nd European Solid-State Circuits Conference, Sep. 2006, Montreux, Switzerland, 2006 IEEE, pp. 380-383.

* cited by examiner

*Primary Examiner* — Giovanni Astacio-Oquendo
*Assistant Examiner* — Alvaro Fortich
(74) *Attorney, Agent, or Firm* — Christensen O'Connor Johnson Kindness PLLC

(57)    ABSTRACT

A power supply noise measurement circuit includes a multiphase filter coupled to receive a power supply signal. The multiphase filter is coupled to output a first filtered power supply signal for a first phase, and a second filtered power supply signal for a second phase. A multiphase amplifier is coupled to the multiphase filter to sample offset voltages in response to the first filter power supply signal during the first phase to set up DC operation points in the multiphase amplifier, and generate an amplified power supply noise signal during the second phase. An overshoot detector is coupled to the multiphase amplifier to detect overshoot events in the amplified power supply noise signal, and an undershoot detector is coupled to the multiphase amplifier to detect undershoot events in the amplified power supply noise signal.

23 Claims, 3 Drawing Sheets

IMAGE SENSOR POWER SUPPLY NOISE DETECTION

BACKGROUND INFORMATION

Field of the Disclosure

The present invention relates generally to circuits. More specifically, examples of the present invention are related to power supplies for use with image sensors.

Background

Electronic devices consume power to operate. Certain types of electronic devices are better able to tolerate noise levels from power supplies than others. For example, a power supply voltage provided to a complementary metal oxide semiconductor (CMOS) image sensor may not be clean (i.e., noisy) if the power supply rejection ratio (PSRR) is not large enough, which may consequently result in noise and ripple from the power supply entering into the image signal paths in the CMOS image sensor resulting in horizontal ripple in the images that are captured by the image sensor. Power supply rejection ratio improvement modules may be added to image sensor power to address noisy power supply conditions. However, power supply rejection ratio improvement modules themselves may introduce performance deterioration in image sensors such as H-banding problems.

BRIEF DESCRIPTION OF THE DRAWINGS

Non-limiting and non-exhaustive examples of the present invention are described with reference to the following figures, wherein like reference numerals refer to like parts throughout the various views unless otherwise specified.

Figure 1:
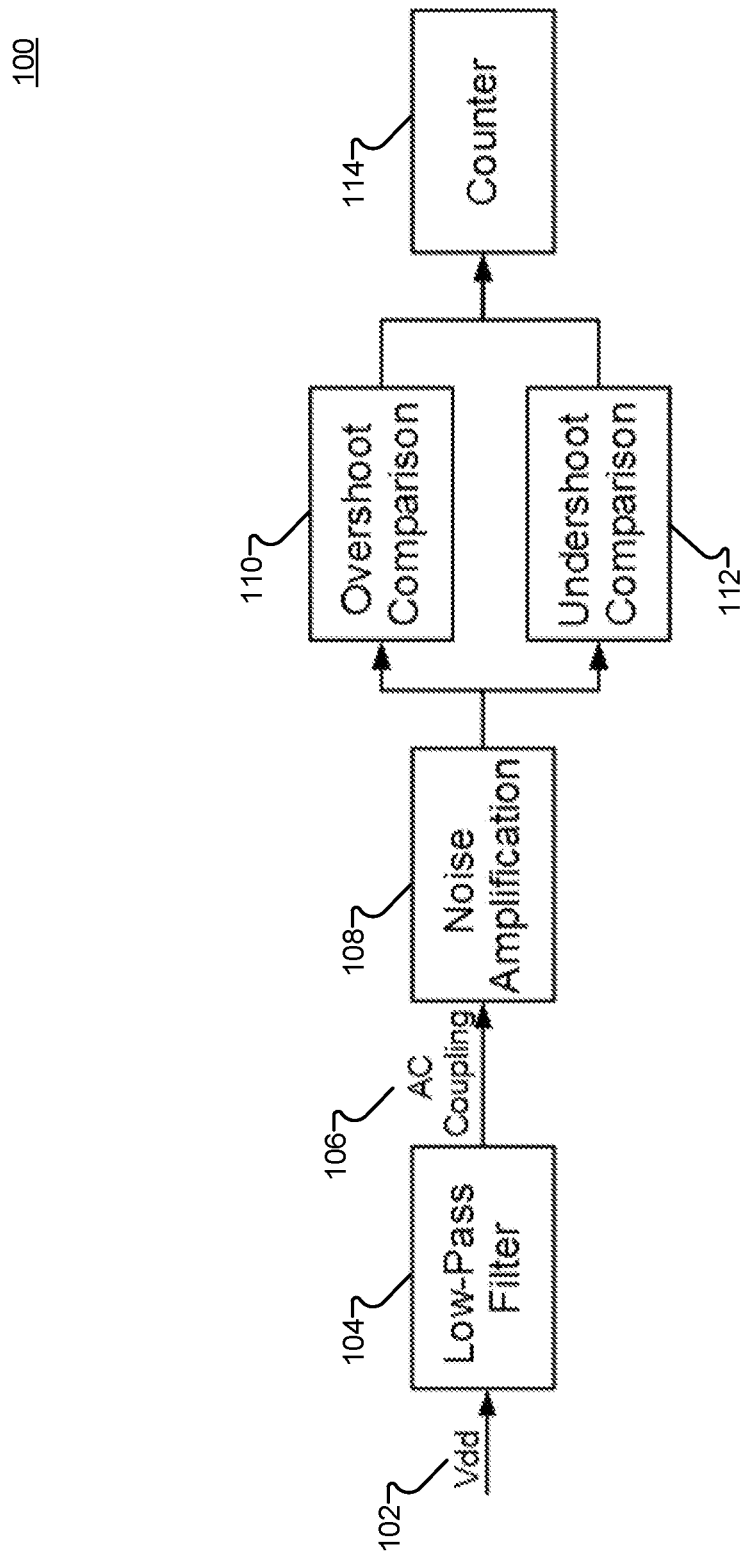
FIG. 1 is a block diagram illustrating one example of a power supply noise measurement circuit in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

As will be shown, methods and apparatuses directed to measuring a noise level of a power supply are disclosed. In the following description, numerous specific details are set forth in order to provide a thorough understanding of the present invention. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment," an embodiment, "one example," or "an example" means that a particular feature, structure, or characteristic described in connection with the embodiment or example is included in at least one embodiment or example of the present invention. Thus, the appearances of the phrases such as "in one embodiment" or "in one example" in various places throughout this specification are not necessarily all referring to the same embodiment or example. Furthermore, the particular features, structures, or characteristics may be combined in any suitable manner in one or more embodiments or examples. The following is a detailed description of the terms and elements used in the description of examples of the present invention by referring to the accompanying drawings.

As will be discussed, examples of power supply noise detection circuits that can measure the noise level in power supplies are described in detail below. As such, examples in accordance with the teachings of the present invention can detect the noise level of a power supply in real time, and therefore enable control circuitry to determine whether a power supply rejection ratio improvement module should be enabled. In this way, an optimized tradeoff can be made between the noise interference from power supply and the banding problem caused by power supply rejection ratio improvement modules. Examples in accordance with the teachings of the present invention can detect several mV noise pulses by providing up to 20 times gain of the power supply noise. In one example, detectable noise frequency ranges from 10 KHz to 10 MHz can be measured in power supply signals in accordance with the teachings of the present invention.

As will be discussed throughout and in greater detail below, examples of a power supply noise measurement circuit 100 in FIG. 1, and a power supply noise measurement circuit 200 in FIG. 2, include "multiphase" circuitry, which operate in different phases. For instance, in the described examples, some of the circuitry included in power supply noise measurement circuit 100, and in power supply noise measurement circuit 200, are coupled alternate between operating in a first phase $\Phi 1$, and a second phase $\Phi 2$. In the examples, only one of the first phase $\Phi 1$ and second phase $\Phi 2$ can be enabled at a time.

To illustrate, FIG. 1 is a block diagram illustrating one example of a power supply noise measurement circuit 100 in accordance with the teachings of the present invention. In one example, power supply noise measurement circuit 100 includes a multiphase filter 104, which is illustrated as a low-pass filter in FIG. 1, coupled to receive a power supply signal 102, which is illustrated as Vdd in FIG. 1. In one example, multiphase filter 104 is coupled to output a first filtered power supply signal for the first phase $\Phi 1$, and output a second filtered power supply signal for a second phase $\Phi 2$. In example, the cutoff frequencies associated with the multiphase filter 104 during the first phase $\Phi 1$ and the second phase $\Phi 2$ define the lower and upper limit bandwidths of noise that is to be detected in power supply signal 102.

A multiphase amplifier 108, which is illustrated as noise amplification in FIG. 1, is coupled to the multiphase filter 104 through an alternating current (AC) coupling 106. It is appreciated that with the AC coupling 106, the direct current (DC) voltage of the power supply is eliminated through AC coupling 106, while the noise information of the filtered power supply signal 102 enters the multiphase amplifier 108. As will be discussed, during the first phase Φ1, the multiphase amplifier 108 is coupled to sample offset voltages in response to the first filtered power supply signal received from multiphase filter 104 to set up DC operation points in the multiphase amplifier 108. During the second phase Φ2, the multiphase amplifier 108 is coupled to generate an amplified power supply noise signal, which is coupled to be received by an overshoot detector 110 and an undershoot detector 112, which are illustrated as overshoot comparison and undershoot comparison, respectively, in FIG. 1. In operation, multiphase amplifier 108 provides enough gain to the noise in the power supply signal 102 to ensure that the noise can be precisely differentiated by comparators included in the later overshoot and undershoot detection stages of power supply noise measurement circuit 100 in accordance with the teachings of the present invention.

In one example, overshoot detector 110 is coupled to the multiphase amplifier 108 to detect noise overshoot peaks, or overshoot events, in the amplified power supply noise signal that is output during the second phase Φ2. Similarly, undershoot detector is coupled to the multiphase amplifier 108 to detect noise undershoot peaks, or undershoot events, in the amplified power supply noise signal that is output during the second phase Φ2. In one example, a counter 114 coupled to the overshoot detector 110 and the undershoot detector 112 to count and sum up the total number of overshoot events detected by overshoot detector 110, and the total number of undershoot events that are detected by undershoot detector 112 to measure a noise level of the power supply in accordance with the teachings of the present invention.

Although not illustrated, in one example, control circuitry, such as for example image sensor control circuitry, may be coupled to counter 114 to evaluate the noise level of power supply signal 102 in real time, and decide if the current power supply is clean enough, and therefore determine whether a power supply rejection ratio improvement module is necessary to be enabled. In this way, an optimized tradeoff can be made between the noise interference in power supply signal 102, and a banding problem from a power supply rejection ratio improvement module in accordance with the teachings of the present invention. It is noted that the actual noise floor of an on-chip power supply is of significance to be measured for the operation of a power supply rejection ratio improvement module and other noise related designs. Indeed, it is appreciated that other circuit designs other than image sensors can also benefit from a power supply noise detection circuit in accordance with the teachings of the present invention.

Figure 2:
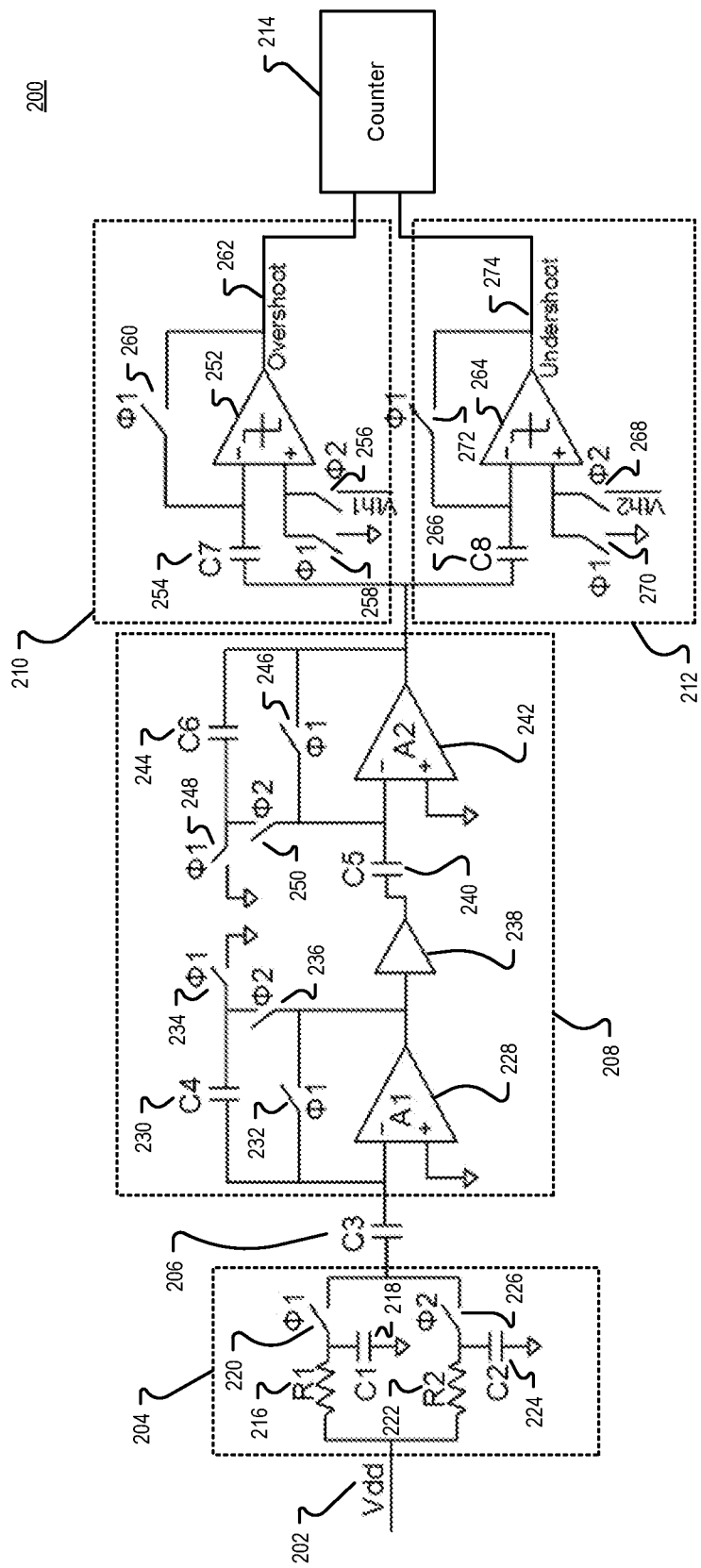
FIG. 2 is a schematic illustrating a detailed example power supply noise measurement circuit in accordance with the teachings of the present invention.

FIG. 2 is a schematic illustrating a detailed example of power supply noise detection circuit 200 in accordance with the teachings of the present invention. In the depicted example, it is appreciated that power supply noise detection circuit 200 of FIG. 2 may be one of example of power supply noise detection circuit 100 of FIG. 1, and that similarly named and numbered elements referenced below are coupled and function similar to as described above.

As illustrated in the depicted example, power supply noise measurement circuit 200 includes a multiphase filter 204 coupled to receive a power supply signal Vdd 202. In the depicted example, multiphase filter 204 includes a first low pass filter, which includes resistance R1 216 and capacitance C1 218, and a second low pass filter, which includes resistance R2 222 and a capacitance C2 224. The first low pass filter is coupled to an output multiphase filter 204 through a first phase Φ1 switch 220, and the second low pass filter is coupled to the output multiphase filter 204 through a second phase Φ2 switch 226 as shown. In one example, if first phase Φ1 switches are turned on, then all second phase Φ2 switches are turned off. Similarly, if second phase Φ2 switches are turned on, the all of the first phase Φ1 switches are turned off.

In one example, the resistance and capacitance values selected for resistance R1 216 and capacitance C1 218 provide a first cutoff frequency, which in one example filter out all noise in power supply signal Vdd 202 greater than 10 KHz. In the example, the resistance and capacitance values selected for resistance R2 222 and capacitance C2 224 provide a second cutoff frequency, which in one example is greater than or equal to the first cutoff frequency. For instance, in one example, the second cutoff frequency provided by resistance R2 222 and capacitance C2 224 of the second low pass filter can be set from 10 KHz to 10 MHz.

Thus, in operation, during the first phase Φ1, first low pass filter is coupled to receive the power supply signal Vdd 202 to generate a first filtered power supply signal, which as will be discussed, is used to generate a stable voltage reference for the multiphase amplifier 208, through first phase Φ1 switch 220 during the first phase Φ1. Second low pass filter is coupled to receive the power supply signal Vdd 202 to output the second filtered power supply signal to the multiphase amplifier 208 through second phase Φ2 switch 226 during the second phase Φ2.

As shown in the example depicted in FIG. 2, multiphase amplifier 208 is AC coupled to the multiphase filter 204 through a first AC coupling capacitance 206. In the example, first AC coupling capacitance 206 removes the DC component from the filtered power supply signal Vdd 202, and allows the noise information in power supply signal Vdd 202 to pass into the multiphase amplifier 208.

In the illustrated example, multiphase amplifier 208 includes a first stage amplifier A1 228 having an input (illustrated as the inverting input of first stage amplifier A1 228) that is capacitively coupled to the multiphase filter 204 to receive the first filtered power supply signal Vdd 202 during the first phase Φ1 and the second filtered power supply signal Vdd 202 during the second phase Φ2. In the example, the non-inverting input of first stage amplifier A1 228 is coupled to ground. A first stage capacitance C4 230 is coupled to the first stage amplifier A1 228 to sample a first offset voltage of the first stage amplifier A1 with first phase Φ1 switches 232 and 234 closed, and second phase Φ2 switch 236 open, during the first phase Φ1. During the second phase Φ2, first phase Φ1 switches 232 and 234 are opened, and second phase Φ2 switch 236 is closed, such that the first stage capacitance C4 230 is coupled between the input and an output of the first stage amplifier A1 228 during the second phase Φ2.

Multiphase amplifier 208 also includes a second stage amplifier A2 having an input (illustrated as the inverting input of second stage amplifier A2 242) that is capacitively coupled to the output of the first stage amplifier A1 228 through a second AC coupling capacitance C5 240. In the example, the non-inverting input of second stage amplifier A2 242 is coupled to ground. In one example, a buffer 238 is coupled between the first stage amplifier A1 228 and the second stage amplifier A2 242 as shown. In one example, the buffer 238 includes a source follower structure that is inserted between the first stage amplifier A1 228 and the second stage amplifier A2 242 as shown to separate the load effect and ensure adequate bandwidth.

A second stage capacitance C6 244 is coupled to the second stage amplifier A2 242 to sample a second offset voltage of the second stage amplifier A2 242 with first phase Φ1 switches 246 and 248 closed, and second phase Φ2 switch 250 open during the first phase Φ1. During the second phase Φ2, first phase Φ1 switches 246 and 248 are opened, and second phase Φ2 switch 250 is closed, such that the second stage capacitance C6 244 is coupled between the input and an output of the second stage amplifier A2 242 during the second phase Φ2.

It is appreciated that the first stage amplifier A1 228 and the second stage amplifier A2 242 are coupled to provide unity gain during the first phase Φ1 with the first phase Φ1 switches closed, and second phase Φ2 switches opened, as discussed above. Thus, during the first phase Φ1, multiphase amplifier 208 is coupled to sample offset voltages with first stage capacitance C4 230 and second stage capacitance C6 244 in response to the first filtered power supply signal Vdd 208 from the first low pass filter during the first phase Φ1 to set up DC operation points in the multiphase amplifier 208 with first stage capacitance C4 230 and second stage capacitance C6 244.

During the second phase Φ2, with the first phase Φ1 switches opened, and second phase Φ2 switches closed, as discussed above, the multiphase amplifier 208 is configured to generate an amplified power supply noise signal at the output of multiphase amplifier 208 in accordance with the teachings of the present invention. In the depicted example, the first stage amplifier A1 228 and the second stage amplifier A2 242 are coupled to provide a gain equal to a product of the first and second AC coupling capacitances C3 206 and C5 240 divided by a product of the first and second stage capacitances C4 230 and C6 244 during the second phase Φ2. In other words, the gain provided with the first stage amplifier A1 228 and the second stage amplifier A2 242 during the second phase Φ2 can be determined according to Equation 1 below:

$$\text{Gain} = \frac{(C3 \times C5)}{(C4 \times C6)} \quad \text{(Equation 1)}$$

Continuing with the example depicted in FIG. 2, an overshoot detector 210 is coupled to the multiphase amplifier 208 to detect overshoot events in the amplified power supply noise signal received from the output of multiphase amplifier 208. In addition, an undershoot detector 212 is also coupled to the multiphase amplifier 208 to detect undershoot events in the amplified power supply noise signal received from the output of multiphase amplifier 208.

As shown in the illustrated example, overshoot detector 210 includes an overshoot comparator 252 having a first input (illustrated as the inverting input of overshoot comparator 252) capacitively coupled to the output of multiphase amplifier 208 through a third AC coupling capacitance C7 254. The overshoot comparator 252 has a second input (illustrated as the non-inverting input of overshoot comparator 252) that is coupled to receive an overshoot threshold reference voltage Vth1 through second phase Φ2 switch 256 during the second phase Φ2. During the first phase Φ1, first phase Φ1 switches 258 and 260 are closed, and second phase Φ2 switch 256 is opened, resulting in the non-inverting input of overshoot comparator 252 being coupled to ground, and the inverting input of overshoot comparator 252 being coupled to the output of overshoot comparator 252. This results in the overshoot detector 210 being coupled to provide unity gain during the first phase Φ1.

As shown in the illustrated example, undershoot detector 212 includes an undershoot comparator 264 having a first input (illustrated as the inverting input of undershoot comparator 264) capacitively coupled to the output of multiphase amplifier 208 through a fourth AC coupling capacitance C8 266. The undershoot comparator 264 has a second input (illustrated as the non-inverting input of overshoot comparator 264) that is coupled to receive an undershoot threshold reference voltage Vth2 through second phase Φ2 switch 268 during the second phase Φ2. During the first phase Φ1, first phase Φ1 switches 270 and 272 are closed, and second phase Φ2 switch 268 is opened, resulting in the non-inverting input of undershoot comparator 264 being coupled to ground, and the inverting input of undershoot comparator 264 being coupled to the output of undershoot comparator 264. This results in the undershoot detector 212 also being coupled to provide unity gain during the first phase Φ1.

The example depicted in FIG. 2 also shows that a counter 214 is coupled to the overshoot detector 210 and the undershoot detector 212 to count the overshoot events detected by overshoot detector 210, and the undershoot events detected by the undershoot detector 212 to measure a noise level of the power supply in accordance with the teachings of the present invention. As is also mentioned above with respect to FIG. 1, although not illustrated, in one example, control circuitry, such as for example image sensor control circuitry, may be coupled to counter 214 to evaluate the noise level of power supply signal Vdd 202 in real time and provide a control signal in response to a determination of whether the current power supply is clean enough, and therefore whether a power supply rejection ratio improvement module is necessary to be enabled. In this way, an optimized tradeoff can be made between the noise interference in power supply signal Vdd 202, and a banding problem from a power supply rejection ratio improvement module in accordance with the teachings of the present invention. In addition, it is appreciated that other circuit designs other than image sensors can also benefit from a power supply noise detection circuit in accordance with the teachings of the present invention.

Figure 3:
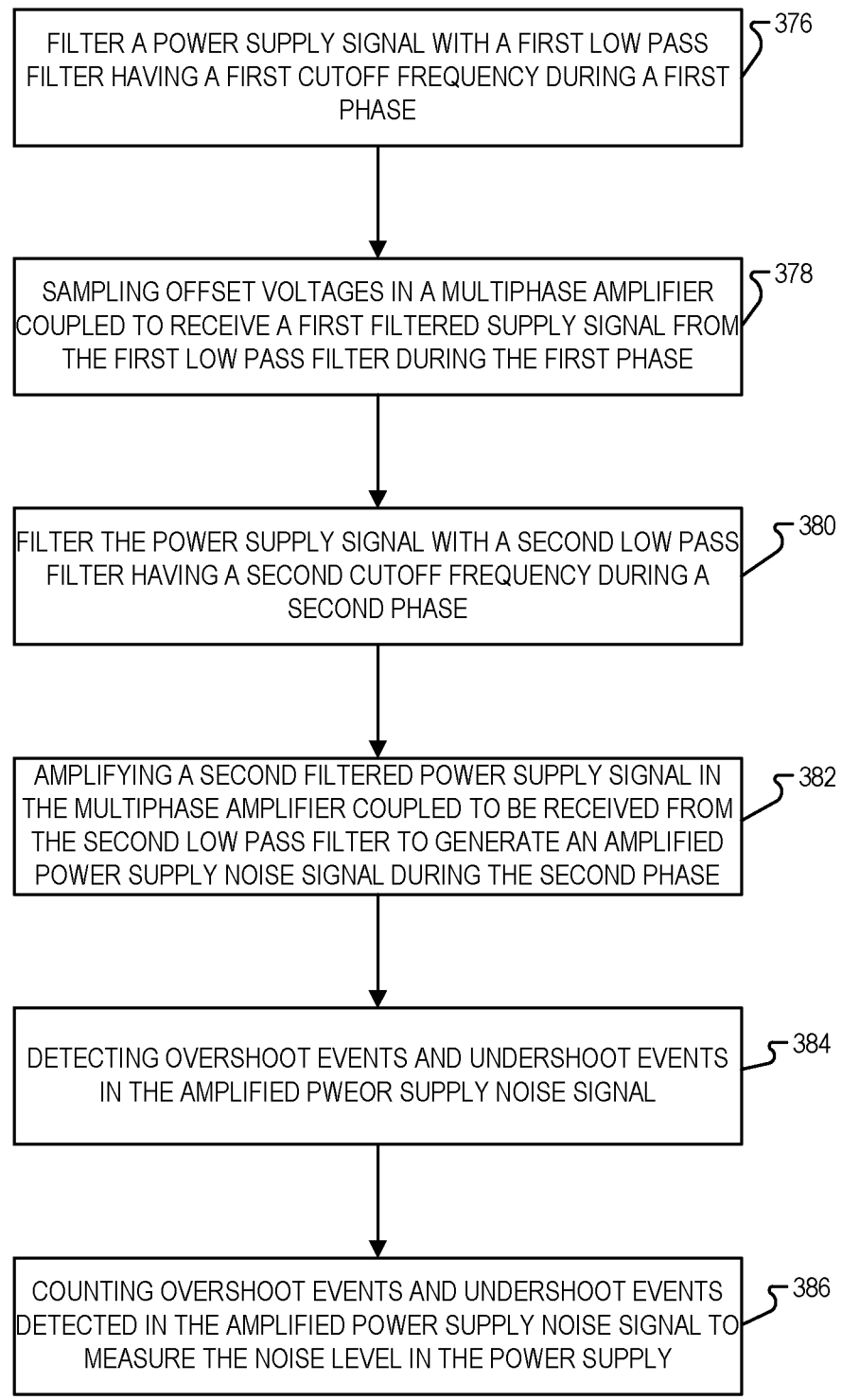
FIG. 3 is a flow chart illustrating one example of process for measuring a noise level of a power supply in accordance with the teachings of the present invention.

FIG. 3 is a flow chart illustrating one example of process 300 for measuring a noise level of a power supply in accordance with the teachings of the present invention. In the depicted example, it is appreciated that process 300 of FIG. 3 describes a process that may utilize an example power supply noise detection circuit 200 of FIG. 2 or an example power supply noise detection circuit 100 of FIG. 1, and that similarly named and numbered elements referenced below are coupled and function similar to as described above. Accordingly, elements in FIG. 1 and/or FIG. 2 may be also referred to below for explanation purposes. In addition, it is appreciated that the order in which some or all of the process occurs in FIG. 3 should not be deemed limiting. Rather, one of ordinary skill in the art having the benefit of the present disclosure will understand that some of the process may be executed in a variety of orders not illustrated, or even in parallel.

At process block 376, a power supply signal of the power supply is filtered with a first low pass filter having a first cutoff frequency during a first phase Φ1. For instance, as described in the examples above, multiphase filter 104 or 204 having a first low pass filter R1C1 may be coupled to receive and filter power supply signal Vdd 102 or 202. At process block 378, offset voltages are sampled in a multiphase amplifier coupled to receive a first filtered power supply signal from the first low pass filter to set up DC operation points in the multiphase amplifier during the first phase Φ1. For example, as described above, offset voltages are sampled with first and second stage capacitances C4 230 and C6 244 during the first phase Φ1.

At process block 380, the power supply signal is filtered with a second low pass filter having a second cutoff frequency during a second phase Φ2. For instance, as described in the examples above, multiphase filter 104 or 204 having a second low pass filter R2C2 may be coupled to receive and filter power supply signal Vdd 102 or 202. At process block 382, the second filtered power supply signal is amplified in the multiphase amplifier coupled to be received from the second low pass filter to generate an amplified power supply noise signal during the second phase Φ2. For instance, as described above, the first stage amplifier A1 228 and the second stage amplifier A2 242 are coupled to provide a gain equal to a product of the first and second AC coupling capacitances C3 206 and C5 240 divided by a product of the first and second stage capacitances C4 230 and C6 244 during the second phase Φ2.

At process block 384, overshoot events and undershoot events are detected in the amplified power supply noise signal. For instance, overshoot detector 110 or 210 and undershoot detector 112 or 212 are coupled to detect overshoot and undershoot events in the amplified power supply noise signal output from the multiphase amplifier 108 or 208. At process block 386, the overshoot events and undershoot events detected in the amplified power supply noise signal are counted to measure the noise level in the power supply. For example, a counter 114 or 214 is coupled to the overshoot detector 110 or 210 and the undershoot detector 112 or 212 to count and sum up the total number of overshoot events and the total number of undershoot events that are detected to measure a noise level of the power supply.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention. Indeed, it is appreciated that the specific example voltages, currents, frequencies, power range values, times, etc., are provided for explanation purposes and that other values may also be employed in other embodiments and examples in accordance with the teachings of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A power supply noise measurement circuit, comprising:
    a multiphase filter coupled to receive a power supply signal, wherein the multiphase filter is coupled to output a first filtered power supply signal for a first phase, and wherein the multiphase filter is coupled to output a second filtered power supply signal for a second phase;
    a multiphase amplifier coupled to the multiphase filter, wherein the multiphase amplifier is coupled to sample offset voltages in response to the first filtered power supply signal during the first phase to set up DC operation points in the multiphase amplifier, and wherein the multiphase amplifier is coupled to generate an amplified power supply noise signal during the second phase;
    an overshoot detector coupled to the multiphase amplifier to detect overshoot events in the amplified power supply noise signal;
    an undershoot detector coupled to the multiphase amplifier to detect undershoot events in the amplified power supply noise signal.

2. The power supply noise measurement circuit of claim 1 further comprising a counter coupled to the overshoot detector and the undershoot detector to count the overshoot events and the undershoot events to measure a noise level of the power supply.

3. The power supply noise measurement circuit of claim 1, wherein the multiphase filter comprises:
    a first low pass filter having a first cutoff frequency and coupled to receive the power supply signal, wherein the first low pass filter is coupled to output the first filtered power supply signal to generate a stable voltage reference for the multiphase amplifier during the first phase; and
    a second low pass filter having a second cutoff frequency and coupled to receive the power supply signal, wherein the second cutoff frequency is greater than or equal to the first cutoff frequency, wherein the second low pass filter is coupled to output the second filtered power supply signal to the multiphase amplifier during the second phase.

4. The power supply noise measurement circuit of claim 1 further comprising a first AC coupling capacitance coupled between the multiphase filter and the multiphase amplifier to capacitively couple the multiphase filter to the multiphase amplifier.

5. The power supply noise measurement circuit of claim 4, wherein the multiphase amplifier comprises:
    a first stage amplifier having an input capacitively coupled to the multiphase filter to receive the first filtered power supply signal during the first phase and the second filtered power supply signal during the second phase;
    a first stage capacitance coupled to the first stage amplifier to sample a first offset voltage of the first stage amplifier during the first phase, wherein the first stage capacitance is coupled between the input and an output of the first stage amplifier during the second phase;
    a second stage amplifier having an input capacitively coupled to the output of the first stage amplifier through a second AC coupling capacitance; and
    a second stage capacitance coupled to the second stage amplifier to sample a second offset voltage of the second stage amplifier during the first phase, wherein the second stage capacitance is coupled between the input and an output of the second stage amplifier during the second phase.

6. The power supply noise measurement circuit of claim 5, wherein the multiphase amplifier further comprises a buffer coupled between the first stage amplifier and the second stage amplifier.

7. The power supply noise measurement circuit of claim 5, wherein the first stage amplifier and the second stage amplifier are coupled to provide unity gain during the first phase.

8. The power supply noise measurement circuit of claim 5, wherein the first stage amplifier and the second stage amplifier are coupled to provide a gain equal to a product of the first and second AC coupling capacitances divided by a product of the first and second stage capacitances during the first phase.

9. The power supply noise measurement circuit of claim 1, wherein the overshoot detector comprises an overshoot comparator having a first input capacitively coupled to the multiphase amplifier through a third AC coupling capacitance, wherein the overshoot comparator has a second input coupled to receive an overshoot threshold reference voltage during the second phase.

10. The power supply noise measurement circuit of claim 9, wherein the overshoot detector is coupled to provide unity gain during the first phase.

11. The power supply noise measurement circuit of claim 1, wherein the undershoot detector comprises an undershoot comparator having a first input capacitively coupled to the multiphase amplifier through a fourth AC coupling capacitance, wherein the undershoot comparator has a second input coupled to receive an undershoot threshold reference voltage during the second phase.

12. The power supply noise measurement circuit of claim 11, wherein the undershoot detector is coupled to provide unity gain during the first phase.

13. The power supply noise measurement circuit of claim 1, wherein only one of the first and second phases is coupled to be enabled at a time.

14. A method of measuring a noise level of a power supply, comprising:
    filtering a power supply signal of the power supply with a first low pass filter having a first cutoff frequency during a first phase;
    sampling offset voltages in a multiphase amplifier coupled to receive a first filtered power supply signal from the first low pass filter to set up DC operation points in the multiphase amplifier during the first phase;
    filtering the power supply signal with a second low pass filter having a second cutoff frequency during a second phase, wherein the second cutoff frequency is greater than or equal to the first cutoff frequency;
    amplifying a second filtered power supply signal in the multiphase amplifier coupled to be received from the second low pass filter to generate an amplified power supply noise signal during the second phase; and
    detecting overshoot events and undershoot events in the amplified power supply noise signal.

15. The method of measuring a noise level of a power supply of claim 14 further comprising counting the overshoot events and undershoot events detected in the amplified power supply noise signal to measure the noise level in the power supply.

16. The method of measuring a noise level of a power supply of claim 14, wherein said filtering the power supply signal of the power supply with the first low pass filter comprises filtering out noise in the power supply signal with a frequency greater than the first cutoff frequency to generate a stable voltage reference for the multiphase amplifier during the first phase.

17. The method of measuring a noise level of a power supply of claim 14, wherein said sampling offset voltages in the multiphase amplifier comprises coupling first and second stage amplifiers in the multiphase amplifier as unity gain buffers during the first phase.

18. The method of measuring a noise level of a power supply of claim 14 further comprising AC coupling an input of the multiphase amplifier to the first and second low pass filters.

19. The method of measuring a noise level of a power supply of claim 14, wherein said sampling offset voltages in the multiphase amplifier comprises:
    sampling a first offset voltage of a first stage amplifier of the multiphase amplifier with a first stage capacitance coupled to the first stage amplifier during the first phase; and
    sampling a second offset voltage of a second stage amplifier of the multiphase amplifier with a second stage capacitance coupled to the second stage amplifier during the first phase.

20. The method of measuring a noise level of a power supply of claim 18 further comprising:
    coupling the first stage capacitance between an input and an output of the first stage amplifier during the second phase; and
    coupling the second stage capacitance between an input and an output of the second stage amplifier during the second phase.

21. The method of measuring a noise level of a power supply of claim 14, wherein the overshoot detector comprises an overshoot comparator having a first input capacitively coupled to the multiphase amplifier through a third AC coupling capacitance, the method further comprising:
    coupling the overshoot comparator to provide unity gain during the first phase; and
    coupling a second input of the overshoot comparator to receive an overshoot threshold reference voltage during the second phase.

22. The method of measuring a noise level of a power supply of claim 14, wherein the undershoot detector comprises an undershoot comparator having a first input capacitively coupled to the multiphase amplifier through a fourth AC coupling capacitance, the method further comprising:
    coupling the undershoot comparator to provide unity gain during the first phase; and
    coupling a second input of the undershoot comparator to receive an undershoot threshold reference voltage during the second phase.

23. The method of measuring a noise level of a power supply of claim 14 further comprising enabling only one of the first phase and second phase at a time.

* * * * *